US011309318B2

(12) United States Patent
Jin

(10) Patent No.: US 11,309,318 B2
(45) Date of Patent: Apr. 19, 2022

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 141 days.

(21) Appl. No.: 16/887,969

(22) Filed: May 29, 2020

(65) Prior Publication Data
US 2020/0381440 A1  Dec. 3, 2020

(30) Foreign Application Priority Data

May 30, 2019 (CN) .......................... 201910465379.6

(51) Int. Cl.
*H01L 27/11* (2006.01)
*H01L 29/66* (2006.01)
*H01L 21/311* (2006.01)

(52) U.S. Cl.
CPC .... *H01L 27/1104* (2013.01); *H01L 21/31144* (2013.01); *H01L 29/66795* (2013.01)

(58) Field of Classification Search
CPC .......... H01L 27/1104; H01L 21/31144; H01L 29/66795; H01L 27/0207; H01L 27/0886; H01L 21/823431; H01L 27/11; H01L 21/8239
See application file for complete search history.

(56) References Cited

U.S. PATENT DOCUMENTS

| | | | |
|---|---|---|---|
| 10,553,592 B2 * | 2/2020 | Zhou | H01L 21/823814 |
| 10,847,521 B2 * | 11/2020 | Huang | H01L 27/1104 |
| 2015/0243667 A1 * | 8/2015 | Liaw | H01L 27/1104 257/390 |
| 2016/0163646 A1 * | 6/2016 | Yang | H01L 27/0886 257/401 |
| 2016/0372476 A1 * | 12/2016 | Hung | H01L 27/0207 |

(Continued)

*Primary Examiner* — Bac H Au
(74) *Attorney, Agent, or Firm* — Anova Law Group, PLLC

(57) ABSTRACT

A semiconductor device and a method for forming the semiconductor device are provided. The method includes providing a semiconductor substrate including a first plug-cutting region and a fin-cutting region, and forming an initial to-be-cut fin partially extended to the fin-cutting region. The method also includes forming a gate structure across the initial to-be-cut fin, and forming a dielectric layer covering a sidewall of the gate structure and the initial to-be-cut fin. In addition, the method includes forming a cutting opening over the first plug-cutting region by removing a portion of the dielectric layer and a portion of the initial to-be-cut fin. A remaining initial to-be-cut fin forms a cutting fin. Further, the method includes forming a cutting structure in the cutting opening, and forming a first plug structure in a remaining dielectric layer. The cutting structure cuts the first plug structure in a width direction of the cutting fin.

19 Claims, 9 Drawing Sheets

(56) References Cited

U.S. PATENT DOCUMENTS

| | | | | |
|---|---|---|---|---|
| 2017/0338233 A1* | 11/2017 | Huang | ................ | H01L 27/1104 |
| 2018/0040616 A1* | 2/2018 | Jeong | ................ | H01L 27/0886 |
| 2020/0006354 A1* | 1/2020 | Wen | ................ | H01L 27/0207 |
| 2020/0075602 A1* | 3/2020 | Wang | ................ | H01L 21/31144 |
| 2020/0083232 A1* | 3/2020 | Huang | ................ | H01L 27/0207 |
| 2020/0106441 A1* | 4/2020 | Liaw | ................ | H01L 27/0924 |
| 2020/0227418 A1* | 7/2020 | Kim | ................ | H01L 27/10867 |
| 2020/0357806 A1* | 11/2020 | Liaw | ................ | H01L 29/4966 |
| 2020/0365599 A1* | 11/2020 | Jin | ................ | H01L 27/0924 |
| 2021/0057418 A1* | 2/2021 | Lee | ................ | G11C 5/063 |
| 2021/0098467 A1* | 4/2021 | Fujiwara | ................ | H01L 27/0924 |
| 2021/0313320 A1* | 10/2021 | Liaw | ................ | H01L 27/0207 |

\* cited by examiner

SEMICONDUCTOR DEVICE AND FABRICATION METHOD THEREOF

CROSS-REFERENCES TO RELATED APPLICATIONS

This application claims the priority of Chinese patent application No. 201910465379.6, filed on May 30, 2019, the entirety of which is incorporated herein by reference.

FIELD OF THE DISCLOSURE

The present disclosure generally relates to the field of semiconductor manufacturing and, more particularly, relates to a semiconductor device and fabrication method thereof.

BACKGROUND

With the development of information technology, the amount of stored information has increased dramatically. The increase in the amount of stored information has promoted the rapid development of memory, and at the same time, puts substantially high requirements on the stability of memory.

Basic static random access memory (SRAM) relies on six transistors. The six transistors form two cross-coupled inverters. Each inverter includes a pull-up transistor, a pull-down transistor, and an access transistor.

To obtain sufficient anti-interference ability and access stability, the transistors used to form the memory are mostly fin field-effect transistors (FinFET). In a FinFET, a gate is a 3D structure covering three surfaces of the fin, which can greatly improve circuit control. The application of the FinFET in the memory can improve the data storage stability and integration degree of the memory.

However, the performance of a semiconductor device formed by the SRAM still needs to be improved. The disclosed methods and device structures are directed to solve one or more problems set forth above and other problems.

BRIEF SUMMARY OF THE DISCLOSURE

One aspect of the present disclosure includes a method for forming a semiconductor device. The method includes providing a semiconductor substrate and forming an initial to-be-cut fin on the semiconductor substrate. The semiconductor substrate includes a first plug-cutting region and a fin-cutting region, and the fin-cutting region is located within the first plug-cutting region. The initial to-be-cut fin is partially extended to the fin-cutting region. The method also includes forming a gate structure across the initial to-be-cut fin over the semiconductor substrate, and forming a dielectric layer covering a sidewall of the gate structure over the semiconductor substrate and the initial to-be-cut fin. The fin-cutting region and the first plug-cutting region are located on a side of the gate structure. In addition, the method includes forming a cutting opening over the first plug-cutting region by removing a portion of the dielectric layer that is over the first plug-cutting region and a portion of the initial to-be-cut fin that is over the fin-cutting region. A remaining initial to-be-cut fin forms a cutting fin on a side of the cutting opening, and a sidewall of the cutting opening exposes the gate structure. Further, the method includes forming a cutting structure in the cutting opening, and forming a first plug structure in a remaining dielectric layer on a side of the gate structure. The cutting structure cuts the first plug structure in a width direction of the cutting fin.

Another aspect of the present disclosure includes a semiconductor device. The semiconductor device includes a semiconductor substrate. The semiconductor substrate includes a first plug-cutting region and a fin-cutting region, and the fin-cutting region is located within the first plug-cutting region. The semiconductor device also includes a cutting structure disposed over the first plug-cutting region and the fin-cutting region, and a cutting fin disposed over the semiconductor substrate. The cutting fin is disposed on a side of the cutting structure in an extension direction of the cutting fin, and the cutting structure is adjacent to the cutting fin. In addition, the semiconductor device includes a gate structure across the cutting fin and disposed over the semiconductor substrate, where the cutting structure is adjacent to the gate structure. Moreover, the semiconductor device includes a dielectric layer disposed over the semiconductor substrate and the cutting fin, and covering a sidewall of the gate structure. Further, the semiconductor device includes a first plug structure in the dielectric layer on a side of the gate structure. The cutting structure cuts the first plug structure in a width direction of the cutting fin.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
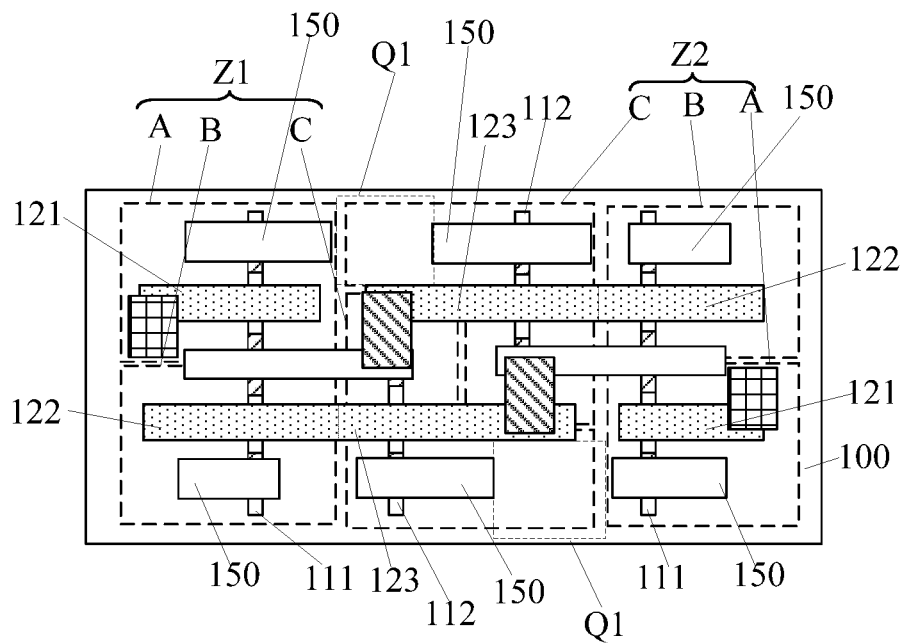
FIG. 1 illustrates a schematic diagram of a static random access memory (SRAM)

FIG. 1 illustrates a schematic diagram of a static random access memory (SRAM). Referring to FIG. 1, the SRAM includes a substrate 100. The substrate 100 includes a first combination region Z1 and a second combination region Z2 centrosymmetric to the first combination region Z1. The first combination region Z1 and the second combination region Z2 each includes a transmission region A, a pull-down region B, and a pull-up region C. The SRAM also includes first fins 111, disposed over the transmission region A and the pull-down region B of the first combination region Z1 and the transmission region A and the pull-down region B of the second combination region Z2, respectively. In addition, the SRAM includes second fins 112, disposed over the pull-up region C of the first combination region Z1 and the pull-up regions C of the second combination region Z2, respectively.

Moreover, the SRAM includes transmission gate structures 121 disposed over the transmission regions A of the substrate 100 (including the transmission region A of the first combination region Z1 and the transmission region A of the second combination region Z2), pull-down gate structures 122 disposed over the pull-down regions B of the substrate 100 (including the pull-down region B of the first combination region Z1 and the pull-down region B of the second combination region Z2), and pull-up gate structures 123 disposed over the pull-up regions C of the substrate 100 (including the pull-up region C of the first combination region Z1 and the pull-up region C of the second combination region Z2). A transmission gate structure 121 is across a first fin 111 over a transmission region A. A pull-down gate structure 122 is across a first fin 111 over a pull-down region B. A pull-up gate structure 123 is across a second fin 112.

Further, the SRAM includes a plurality of first plug structures 150. A first plug structure 150 disposed over the transmission region A of the first combination region Z1 is disconnected from a first plug structure 150 disposed over the pull-up region C of the second combination region. A first plug structure 150 disposed over the transmission region A of the second combination region Z2 is disconnected from a first plug structure 150 disposed over the pull-up region C of the first combination region Z1. A disconnected region is a first plug-cutting region Q1.

The second fin 112 disposed over the first combination region Z1 desires to be cut, such that the second fin 112 disposed over the first combination region Z1 does not extend to the second combination region Z2. The second fin 112 disposed over the second combination region Z2 desires to be cut, such that the second fin 112 disposed over the second combination region Z2 does not extend to the first combination region Z1.

However, in the process of forming the above-described SRAM, the cutting step of the second fin 112 and the cutting step of the first plug-cutting region Q1 are sequentially performed. The cutting step of the second fin 112 adopts a photolithography process, and the cutting step of the first plug-cutting region Q1 adopts another photolithography process, which causes redundant process steps.

Because the second fin 112 is first cut, and then the transmission gate structure 121 and the pull gate structures (including the pull-down gate structure 122 and the pull-up gate structure 123) are formed, the position shift of a pull gate structure and the second fin 112 tends to be substantially large. In an extension direction of the second fin 112, the size of the overlapped region between a pull gate structure and the second fin 112 is smaller than the size of the pull gate structure. Then, for a source-drain layer on a side of a pull gate structure facing away from the first plug-cutting region Q1, the process for forming the source-drain layer includes: forming a recess in the second fin on the side of the pull gate structure facing away from the first plug-cutting region Q1, and forming the source-drain layer in the recess. Because in the extension direction of the second fin 112, the size of the overlapped region between the pull gate structure and the second fin 112 is smaller than the size of the pull-gate structure, a sidewall surface of the recess facing toward the first plug-cutting region Q1 is made of a material different from the second fin 112, and the morphology of the source-drain layer is poor.

The present disclosure provides a semiconductor device and a method for forming the semiconductor device. The method may include providing a semiconductor substrate. The semiconductor substrate may include a first plug-cutting region and a fin-cutting region, and the fin-cutting region may be located within the first plug-cutting region. The method may also include forming an initial to-be-cut fin on the semiconductor substrate, where the initial to-be-cut fin may be partially extended to the fin-cutting region; and forming a gate structure across the initial to-be-cut fin over the semiconductor substrate, where the fin-cutting region and the first plug-cutting region may be located at a side of the gate structure. Moreover, the method may include forming a dielectric layer covering a sidewall of the gate structure over the semiconductor substrate and the initial to-be-cut fin; and forming a cutting opening over the first plug-cutting region by removing the dielectric layer disposed over the first plug-cutting region and the initial to-be-cut fin disposed over the fin-cutting region. The initial to-be-cut fin may form a cutting fin on a side of the cutting opening, and a sidewall of the cutting opening may expose the gate structure. Further, the method may include forming a cutting structure in the cutting opening, and forming a first plug structure in the dielectric layer on a side of the gate structure. The cutting structure may cut the first plug structure in a width direction of the cutting fin. The performance of the semiconductor device formed by such method may be improved, and the process steps may be simplified.

Figure 15:
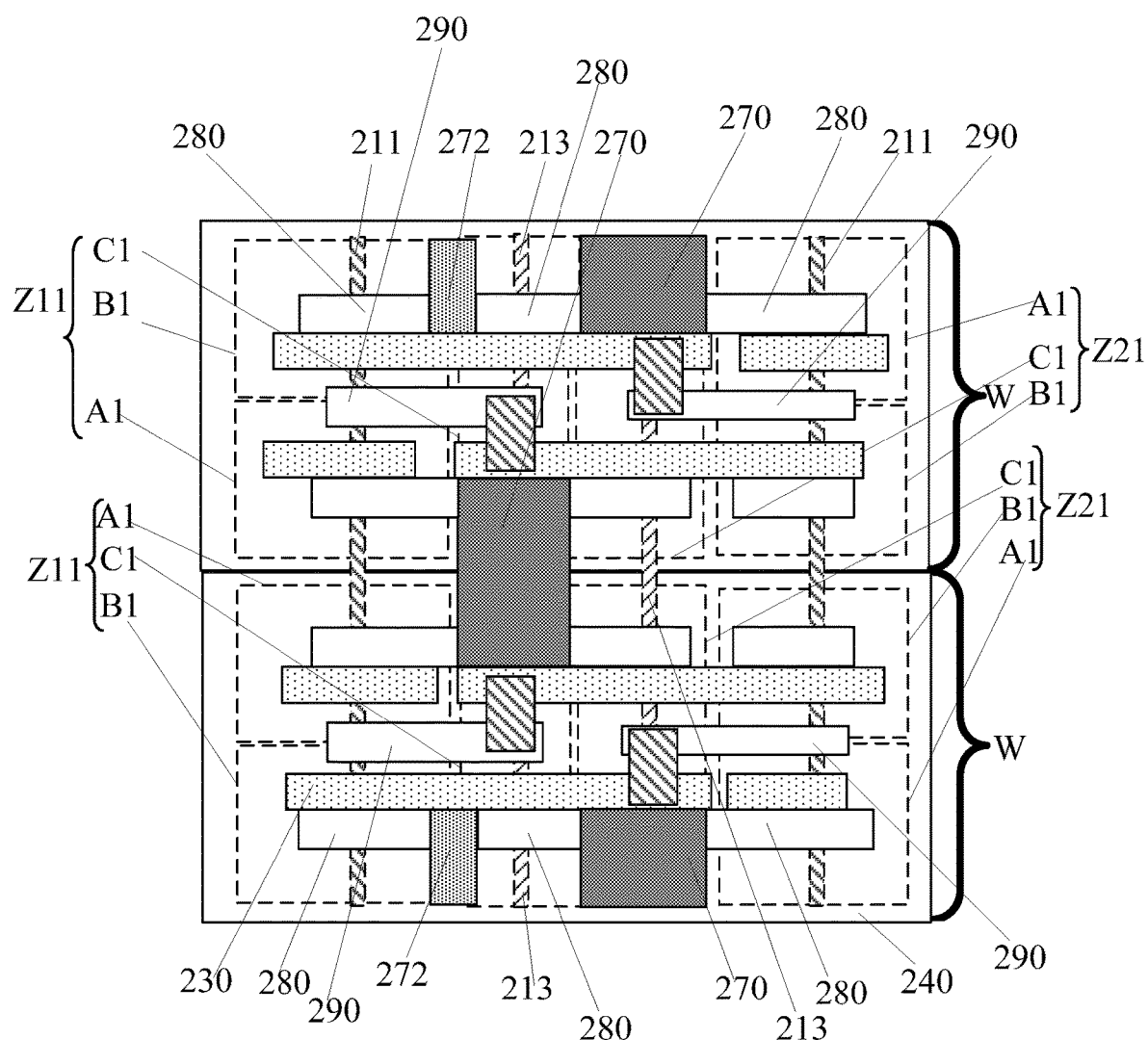
Figure 16:
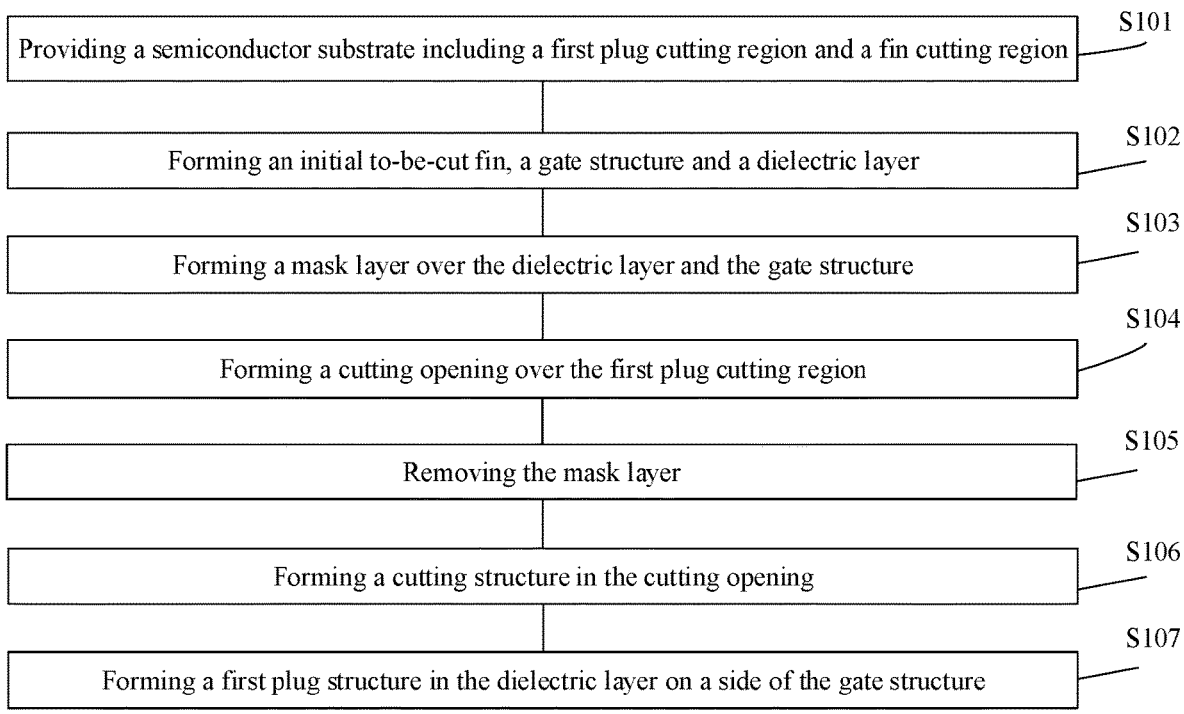
FIG. 16 illustrates an exemplary method for forming a semiconductor device consistent with various disclosed embodiments of the present disclosure.

FIG. 16 illustrates a method for forming a semiconductor device consistent with various disclosed embodiments of the present disclosure, and FIGS. 2-15 illustrate semiconductor structures corresponding to certain stages of the fabrication method.

Figure 2:
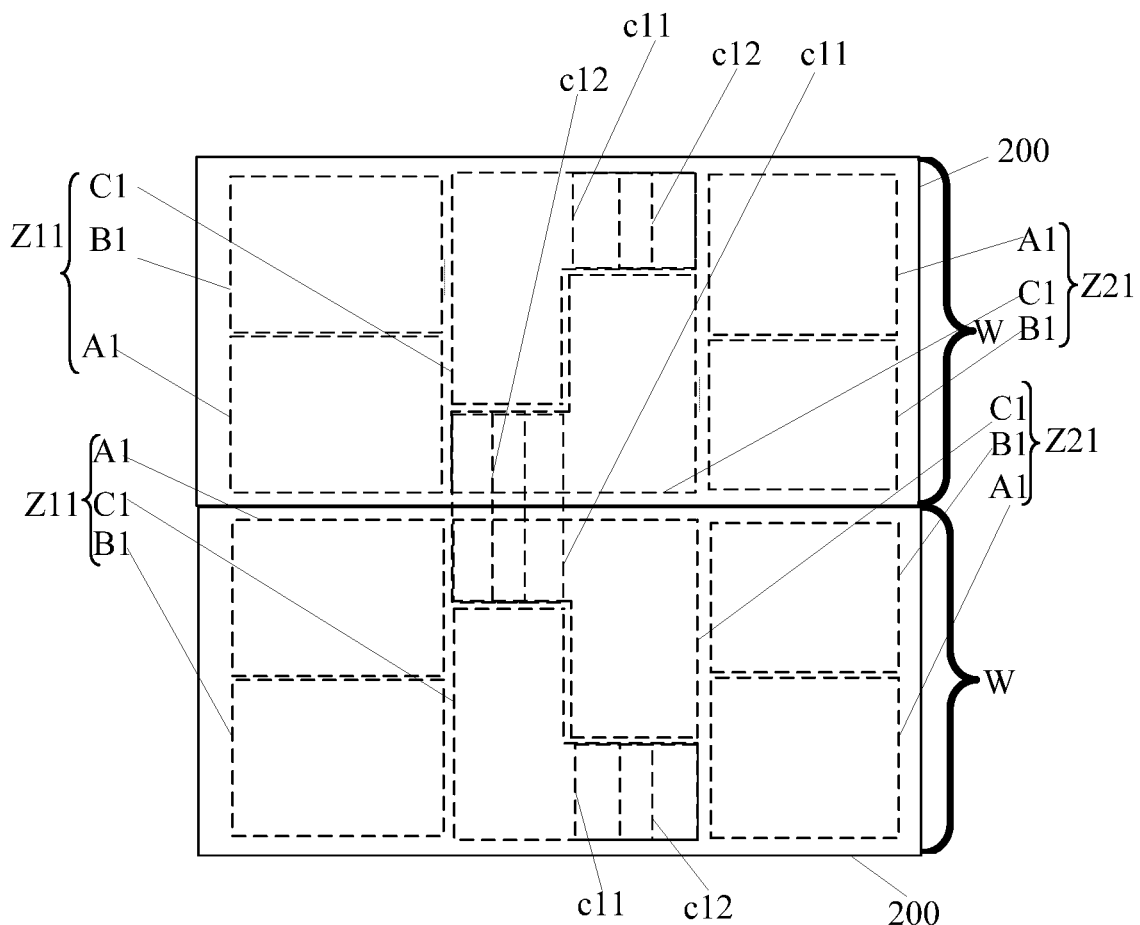
FIGS. 2-15 illustrate semiconductor structures corresponding to certain stages for forming an exemplary semiconductor device consistent with various disclosed embodiments of the present disclosure.

As shown in FIG. 16, at the beginning of the fabrication method, a semiconductor substrate with certain structures may be provided (S101). FIG. 2 illustrates a corresponding semiconductor structure.

Referring to FIG. 2, a semiconductor substrate 200 may be provided. The semiconductor substrate 200 may include a first plug-cutting region c11 and a fin-cutting region c12. The fin-cutting region c12 may be located within the first plug-cutting region c11, and the first plug-cutting region c11 may have an area larger than the fin-cutting region c12.

In one embodiment, for illustrative purposes, the semiconductor device may be a SRAM. In another embodiment, the semiconductor device may not be limited to a SRAM. The semiconductor substrate 200 may provide a process platform for forming a semiconductor device. The semiconductor substrate 200 may be made of monocrystalline silicon, polysilicon, or amorphous silicon. The semiconductor substrate 200 may also be made of silicon, germanium, silicon germanium, gallium arsenide, or any other semiconductor material. In one embodiment, the semiconductor substrate 200 may be made of monocrystalline silicon.

In one embodiment, the semiconductor substrate 200 may include a memory cell region W, and a quantity of the memory cell regions W may be one or more. Each memory cell region W may include a first combination region Z11 and a second combination region Z21 that are centrosymmetric. The first combination region Z11 and the second combination region Z21 each may include a transmission region A1, a pull-down region B1, and a pull-up region C1. The first plug-cutting regions c11 may be respectively located in the pull-up region C1 of the first combination region Z11 and the pull-up region C1 of the second combination region Z21. The positional relationship between the transmission region A1, the pull-down region B1, and the pull-up region C1 may be distinguished according to specific circuit design.

The transmission region A1 of the first combination region Z11 and the transmission region A1 of the second combination region Z21 may be centrosymmetric. The pull-down region B1 of the first combination region Z11 and the pull-down region B1 of the second combination region Z21 may be centrosymmetric. The pull-up region C1 of the first combination region Z11 and the pull-up region C1 of the second combination region Z21 may be centrosymmetric.

In one embodiment, the pull-up region C1 of the first combination region Z11 may be located between the pull-down region B1 of the first combination region Z11 and the transmission region A1 of the second combination region Z21. The pull-up region C1 of the second combination region Z21 may be located between the pull-down region B1 of the second combination region Z21 and the transmission region A1 of the first combination region Z11.

The transmission region A1 and the pull-down region B1 of the first combination region Z11 may be arranged along a first direction, and the transmission region A1 and the pull-down region B1 of the second combination region Z21 may be arranged along the first direction. The pull-down region B1 and the pull-up region C1 of the first combination region Z11 may be arranged along a second direction, and the second direction may be perpendicular to the first direction. The pull-down region B1 and the pull-up region C1 of the second combination region Z21 may be arranged along the second direction. The first plug-cutting region c11 in the first combination region Z11 may be located at a side of the pull-up region C1 of the second combination region Z21 along the first direction. The first plug-cutting region c11 in the second combination region Z21 may be located at a side of the pull-up region C1 of the first combination region Z11 along the first direction. The first plug-cutting region c11 in the first combination region Z11 and the first plug-cutting region c11 in the second combination region Z21 may be centrosymmetric. The fin-cutting region c12 in the first combination region Z11 and the fin-cutting region c12 in the second combination region Z21 may be centrosymmetric.

In one embodiment, for illustrative purposes, there may be two memory cell regions W. In another embodiment, a quantity of the memory cell regions W may be one or more than three.

The transmission region A1 may be configured to form a transmission transistor. The pull-down region B1 may be configured to form a pull-down transistor. The pull-up region C1 may be configured to form a pull-up transistor. The transmission transistor may include a first transmission transistor and a second transmission transistor. The pull-down transistor may include a first pull-down transistor and a second pull-down transistor. The pull-up transistor may include a first pull-up transistor and a second pull-up transistor.

The transmission region A1 of the first combination region Z11 may be configured to form the first transmission transistor, and the transmission region A1 of the second combination region Z21 may be configured to form the second transmission transistor. The pull-down region B1 of the first combination region Z11 may be configured to form the first pull-down transistor, and the pull-down region B1 of the second combination region Z21 may be configured to form the second pull-down transistor. The pull-up region C1 of the first combination region Z11 may be configured to form the first pull-up transistor, and the pull-up region C1 of the second combination region Z21 may be configured to form the second pull-up transistor.

In one embodiment, the types of the transmission transistor and the pull-down transistor may be N-type, and the type of the pull-up transistor may be P-type. The first plug-cutting region c11 may be configured to form a cutting structure.

In one embodiment, an arrangement direction of adjacent memory cell regions W may be parallel to an arrangement direction of the transmission region A1, the pull-up region C1, and the pull-down region B1 of the first combination region Z11.

For adjacent memory cell regions W, the adjacent memory cell regions W may be mirror-symmetric, and the first plug cut regions c11 in the adjacent memory cell regions W may be adjacent to each other.

Figure 3:
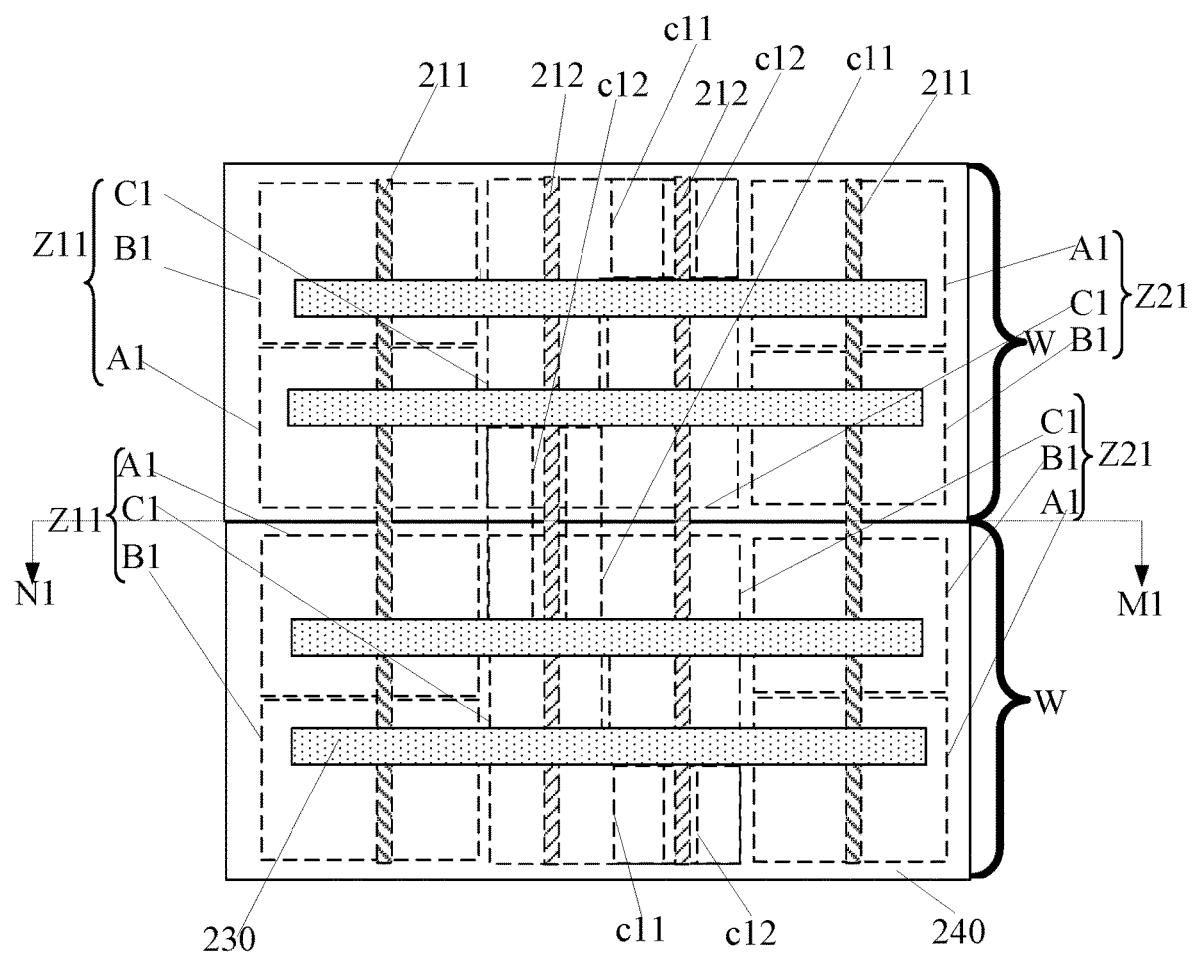
Figure 4:
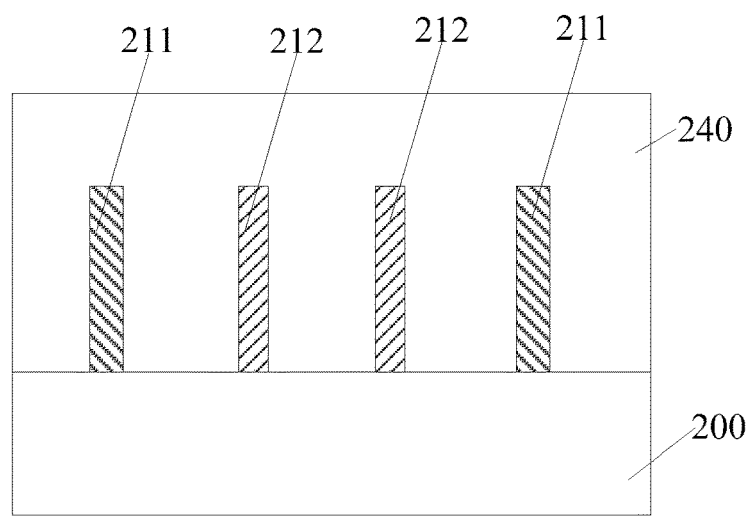

Returning to FIG. 16, after providing the semiconductor substrate, an initial to-be-cut fin, a gate structure and a dielectric layer may be formed (S102). FIGS. 3-4 illustrate a corresponding semiconductor structure.

FIG. 3 illustrates a schematic diagram on the basis of FIG. 2, and FIG. 4 illustrates a cross-sectional view along a cutting line N1-M1 in FIG. 3. Referring to FIGS. 3-4, an initial to-be-cut fin 212 may be formed on the semiconductor substrate 200. The initial to-be-cut fin 212 may be partially extended to the fin-cutting region c12. A gate structure 230 across the initial to-be-cut fin 212 may be formed on the semiconductor substrate 200. The fin-cutting region c12 and the first plug-cutting region c11 may be located at a side of the gate structure 230. A dielectric layer 240 covering a sidewall of the gate structure 230 may be formed over the semiconductor substrate 200 and the initial to-be-cut fin 212.

In one embodiment, initial to-be-cut fins 212 may be formed over the pull-up region C1 of the first combination region Z11 and the pull-up region C1 of the second combination region Z21, respectively. The initial to-be-cut fin 212 over the first combination region Z11 may be extended to the fin-cutting region c12 of the second combination region Z21, and the initial to-be-cut fin 212 over the second combination region Z21 may be extended to the fin-cutting region c12 of the first combination region Z11.

In one embodiment, the method may further include forming first fins 211 over the transmission region A1 and the pull-down region B1 of the first combination region Z11 and over the transmission region A1 and the pull-down region B1 of the second combination region Z21, respectively.

In one embodiment, the gate structure 230 may be across the first fin 211 and the initial to-be-cut fin 212. The fin-cutting region c12 and the first plug-cutting region c11 may be located at the side of the gate structure 230. The dielectric layer 240 may be formed over the semiconductor substrate 200, the first fin 211, and the initial to-be-cut fin 212 to cover the sidewall of the gate structure 230. The dielectric layer 240 may be made of a material including silicon oxide, or a low-K (dielectric constant less than or equal to 3.9) dielectric material.

In one embodiment, before forming the dielectric layer 240, an isolation structure (not illustrated) may be formed over the semiconductor substrate. The isolation structure may cover a portion of the sidewall of the first fin 211 and a portion of the sidewall of the initial to-be-cut fin 212. A surface of the isolation structure may be lower than a top surface of the first fin 211 and a top surface of the initial to-be-cut fin 212. The isolation structure may be made of a material including silicon oxide.

The gate structure 230 may be disposed over a portion of the surface of the isolation structure. After forming the dielectric layer, the dielectric layer may be formed over the isolation structure.

The edges of the initial to-be-cut fin 212 and the first fin 211 may be represented by dashed lines in FIG. 3, to illustrate the positions of the initial to-be-cut fin 212 and the first fin 211. The initial to-be-cut fin 212 and the first fin 211 may be covered by the dielectric layer 240.

In one embodiment, for the SRAM, one memory cell region W may include two initial to-be-cut fins 212. The extension direction of the first fin 211 may be parallel to the extension direction of the initial to-be-cut fin 212. The first fins 211 in adjacent memory cell regions W may be connected together. The initial to-be-cut fins 212 in adjacent memory cell regions W may be connected together. Subsequently, the initial to-be-cut fins 212 in the adjacent memory cell regions W may desire to be disconnected.

An extension direction of the gate structure 230 may be perpendicular to the extension direction of the first fin 211 and the extension direction of the initial to-be-cut fin. The gate structure 230 may include an intrinsic gate structure and a sidewall spacer formed on a sidewall of the intrinsic gate structure. The sidewall spacer may be formed on both sidewalls of the intrinsic gate structure in the extension direction of the initial to-be-cut fin 212, and may also be formed on both sidewalls of the intrinsic gate structure in a width direction of the initial to-be-cut fin 212.

The intrinsic gate structure may include an intrinsic gate dielectric layer and an intrinsic gate electrode layer disposed on the intrinsic gate dielectric layer. The intrinsic gate dielectric layer may be made of a material including silicon oxide, or may be a high-K dielectric layer. The intrinsic gate electrode layer may be made of a material including polysilicon or metal.

Before subsequently cutting the gate structure 230, there may be two gate structures 230 in one memory cell region W. One gate structure 230 may be across the first fin 211 over the transmission region A1 of the first combination region Z11, the initial to-be-cut fin 212 over the pull-up region C1 of the second combination region Z21, and the first fin 211 over the pull-down region B1 of the second combination region Z21. The other gate structure 230 may be across the first fin 211 over the transmission region A1 of the second combination region Z21, the initial to-be-cut fin 212 over the pull-up region C1 of the first combination region Z11, and the first fin 211 over the pull-down region B1 of the first combination region Z11. An arrangement direction of the two gate structures 230 may be perpendicular to the extension direction of the gate structure 230.

In one embodiment, before forming the dielectric layer 240, first source and drain doped layers (not illustrated) may be formed in the initial to-be-cut fin 212 on both sides of the gate structure 230, respectively. Second source and drain doped layers (not illustrated) may be formed in the first fin 211 on both sides of the gate structure 230.

Then, the dielectric layer 240 over the first plug-cutting region c11 and the initial to-be-cut fin 212 over the fin-cutting region c12 may be removed to form a cutting opening over the first plug-cutting region c11. The initial to-be-cut fin 212 may form a cutting fin on a side of the cutting opening, and a sidewall of the cutting opening may expose the gate structure 230.

Figure 5:
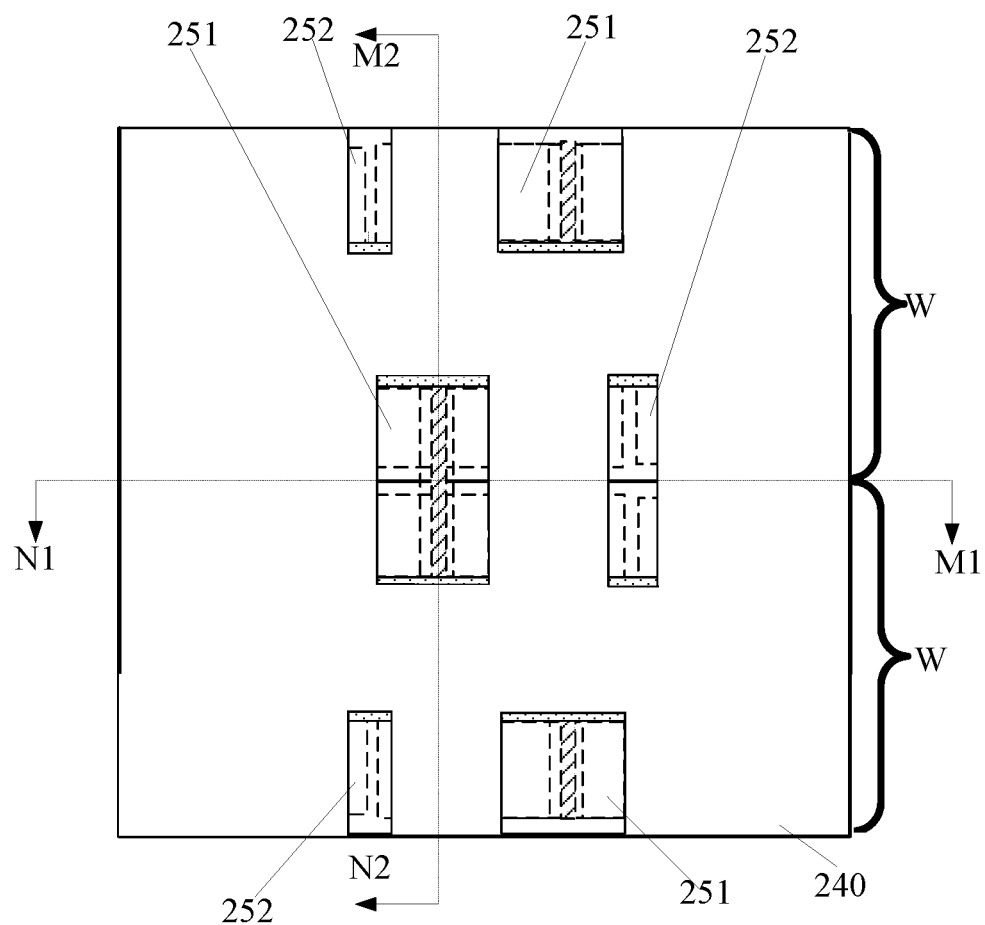
Figure 6:
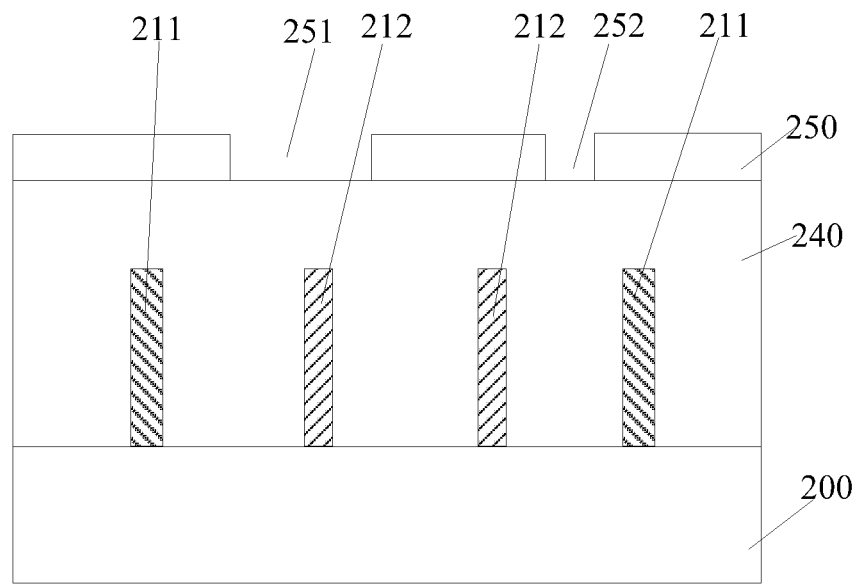
Figure 7:
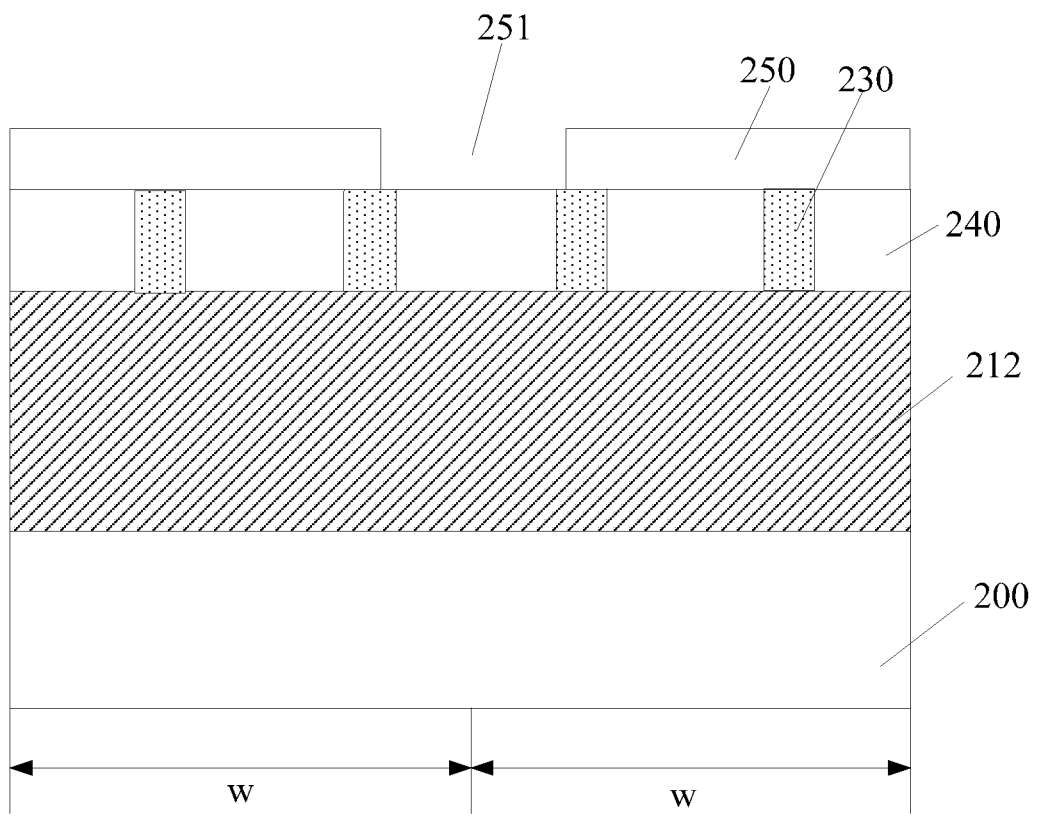

Returning to FIG. 16, after forming the gate structure and the dielectric layer, a mask layer may be formed (S103). FIGS. 5-7 illustrate a corresponding semiconductor structure.

FIG. 5 illustrates a schematic diagram on the basis of FIG. 3, and FIG. 6 illustrates a schematic diagram on the basis of FIG. 4. FIG. 6 illustrates a cross-sectional view along a cutting line N1-M1 in FIG. 5, and FIG. 7 illustrates a cross-sectional view along a cutting line N2-M2 in FIG. 5. Referring to FIGS. 5-7, a mask layer 250 may be formed over the dielectric layer 240 and the gate structure 230. The mask layer 250 may have a mask opening 251, and the mask opening 251 may be located over the first plug-cutting region c11.

The mask layer 250 may be made of a material different from the dielectric layer 240, and the mask layer 250 may be made of a material different from the gate structure 230. The mask layer 250 may be made of a material including a photoresist.

The mask opening 251 may be configured to define a position of the cutting structure. The mask opening 251 may penetrate through the mask layer 250. In one embodiment, the mask opening 251 may be located over the first plug-cutting region c11, and the mask opening 251 may be extended to a portion of the gate structure 230 in the extension direction of the initial to-be-cut fin 212.

In certain embodiments, the mask opening 251 may not expose the gate structure 230. A minimum distance between the sidewall of the mask opening 251 and the sidewall of the gate structure 230 in the extension direction of the initial to-be-cut fin 212 may be equal to zero.

In one embodiment, the mask layer 250 may further have a first additional opening 252. The first additional opening 252 may penetrate through the mask layer 250. The first additional opening 252 may be configured to define a position of a first additional cutting structure. The mask layer 250 may further have a second additional opening (not illustrated), and the second additional opening may be configured to define a position of a second additional cutting structure.

In certain embodiments, the mask layer 250 may merely have the mask opening 251, and the position of the first additional cutting structure and the position of the second additional cutting structure may be defined by an additional photoresist layer.

Figure 8:
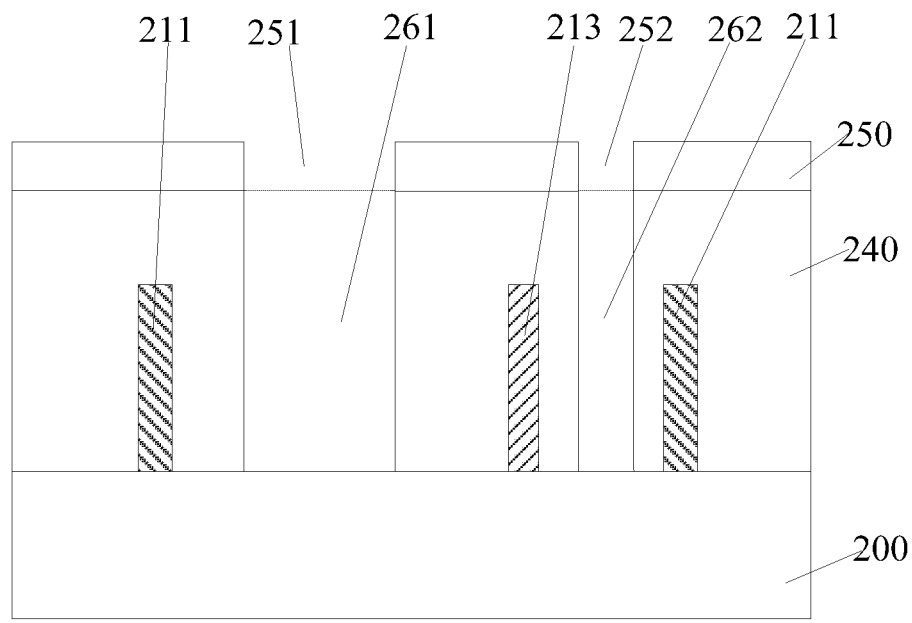
Figure 9:
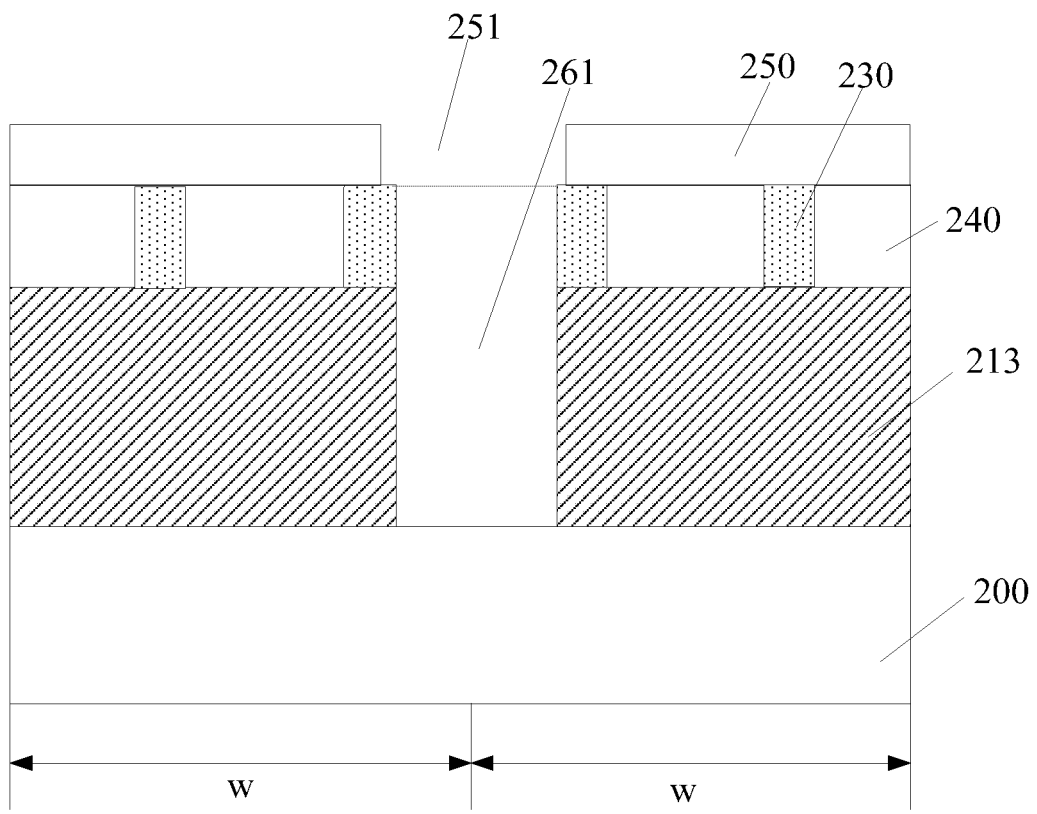

Returning to FIG. 16, after forming the mask layer, a cutting opening may be formed (S104). FIGS. 8-9 illustrate a corresponding semiconductor structure.

FIG. 8 illustrates a schematic diagram on the basis of FIG. 6, and FIG. 9 illustrates a schematic diagram on the basis of FIG. 7. Referring to FIGS. 8-9, the dielectric layer 240 disposed over the first plug-cutting region c11 and the initial to-be-cut fin 212 disposed over the fin-cutting region c12 may be removed using the mask layer 250 as a mask, to form a cutting opening 261. The initial to-be-cut fin 212 may form a cutting fin 213 located on a side of the cutting opening 261.

In one embodiment, the isolation structure disposed over the first plug-cutting region c11 may be removed using the mask layer 250 as a mask. A bottom of the cutting opening 261 may expose the semiconductor substrate 200.

The cutting fins 213 may be disposed over the pull-up region C1 of the first combination region Z11 and the pull-up region C1 of the second combination region Z21, respectively. The cutting fin 213 disposed over the first combination region Z11 may be located on a side of the cutting opening 261 disposed over the second combination region Z21 in the extension direction of the cutting fin 213. After subsequently forming the cutting structure, the cutting fin 213 disposed over the first combination region Z11 may be located on a side of the cutting structure disposed over the second combination region Z21 in the extension direction of the cutting fin 213. The cutting fin 213 disposed over the second combination region Z21 may be located on a side of the cutting opening 261 disposed over the first combination region Z11 in the extension direction of the cutting fin 213. After subsequently forming the cutting structure, the cutting fin 213 disposed over the second combination region Z21 may be located on a side of the cutting structure disposed over the first combination region Z11 in the extension direction of the cutting fin 213.

In one embodiment, the mask opening 251 may be extended to a portion of the gate structure 230 in the extension direction of the initial to-be-cut fin 212. Correspondingly, using the mask layer 250 and the gate structure 230 as a mask, the dielectric layer 240 disposed over the first plug-cutting region c11 and the initial to-be-cut fin 212 disposed over the fin-cutting region c12 may be removed to form the cutting opening 261.

The sidewall of the cutting opening 261 may expose the gate structure 230 and the cutting fin 213. The sidewall of the cutting opening 261 exposing the gate structure 230 may refer to that the sidewall of the cutting opening 261 may expose the sidewall spacer of the gate structure 230.

The size of the overlapped region between the gate structure 230 and the cutting fin 213 in the extension direction of the cutting fin 213 may be equal to the size of the gate structure 230 in the extension direction of the cutting fin 213.

In one embodiment, during the process of removing the dielectric layer 240 disposed over the first plug-cutting region c11 and the initial to-be-cut fin 212 disposed over the fin-cutting region c12, the first source and drain doped layers disposed over the first plug-cutting region c11 and on a side of the gate structure 230 may be removed.

In one embodiment, the method may further include the following. In the process of removing the dielectric layer 240 disposed over the first plug-cutting region c11 and the initial to-be-cut fin 212 disposed over the fin-cutting region c12 using the mask layer 250 as a mask, the dielectric layer 240 at a bottom of the first additional opening 252 may be etched to form a first additional cutting opening 262 in the dielectric layer 240 at the bottom of the first additional opening 252, and the dielectric layer at a bottom of the second additional opening may be etched to form a second additional cutting opening in the dielectric layer at the bottom of the second additional opening.

In certain embodiments, the cutting opening 261, the first additional cutting opening 262, and the second additional cutting opening may be formed by different photolithography processes, respectively.

Figure 10:
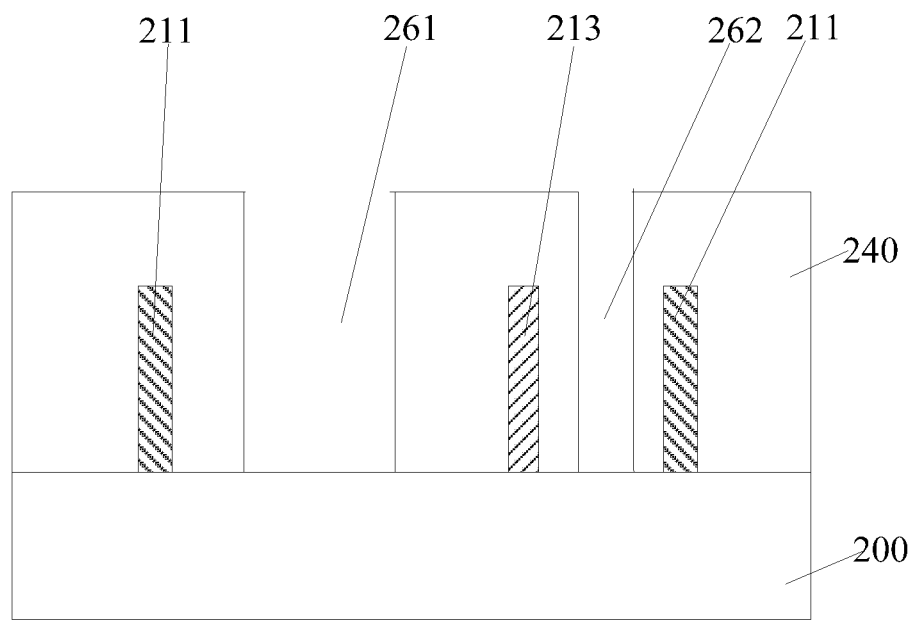
Figure 11:
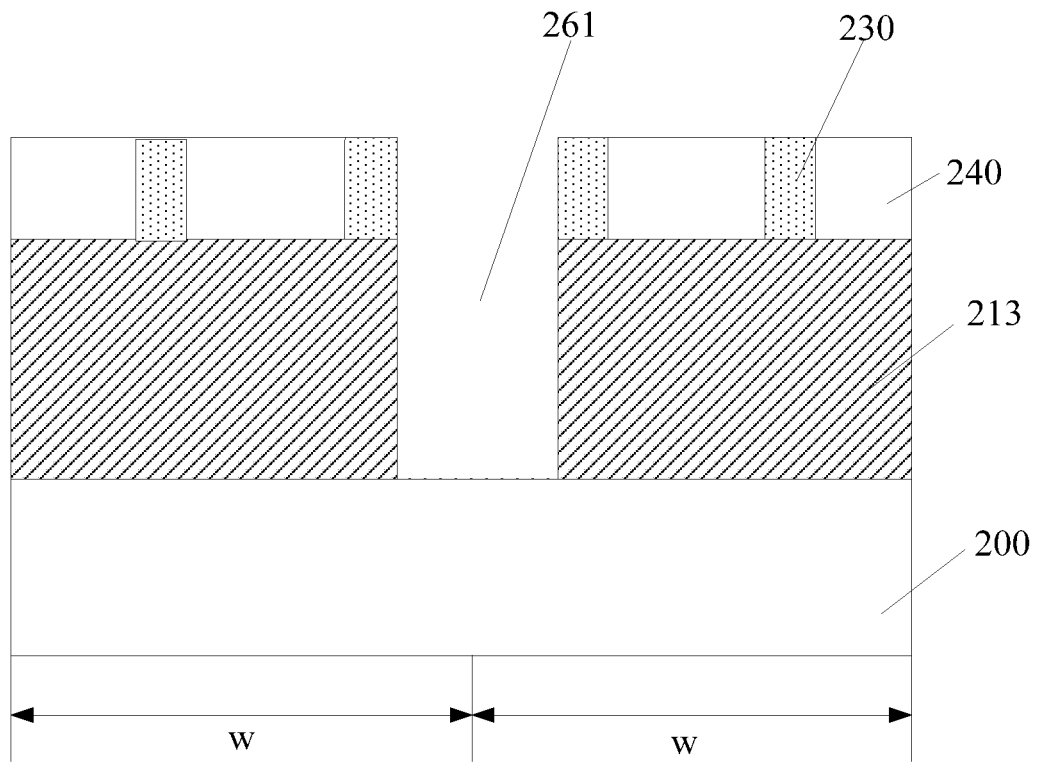

Returning to FIG. 16, after forming the cutting opening, the mask layer may be removed (S105). FIGS. 10-11 illustrate a corresponding semiconductor structure.

FIG. 10 illustrates a schematic diagram on the basis of FIG. 8, and FIG. 11 illustrates a schematic diagram on the basis of FIG. 9. Referring to FIGS. 10-11, after removing the dielectric layer 240 disposed over the first plug-cutting region c11 and the initial to-be-cut fin 212 disposed over the fin-cutting region c12, the mask layer 250 may be removed.

Figure 12:
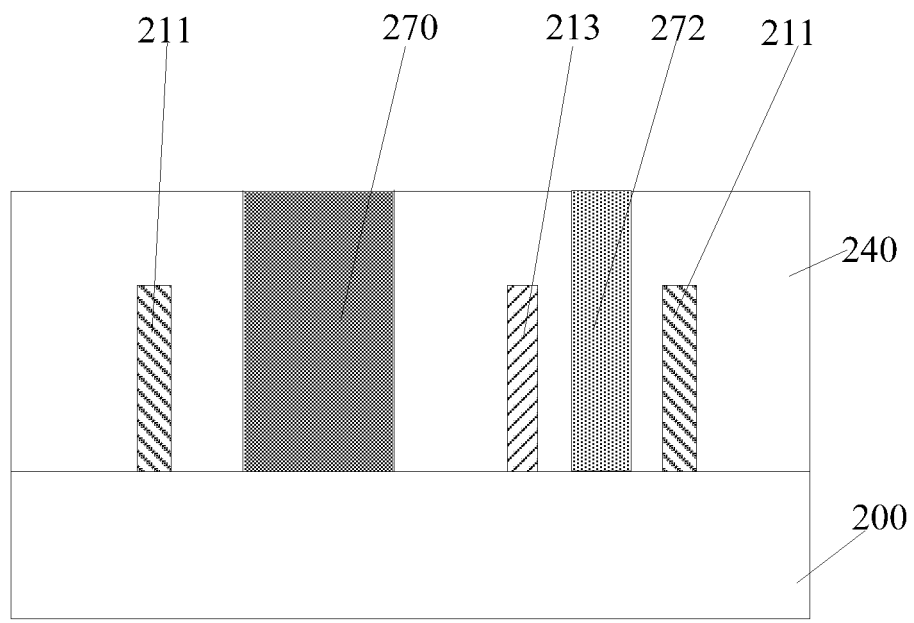
Figure 13:
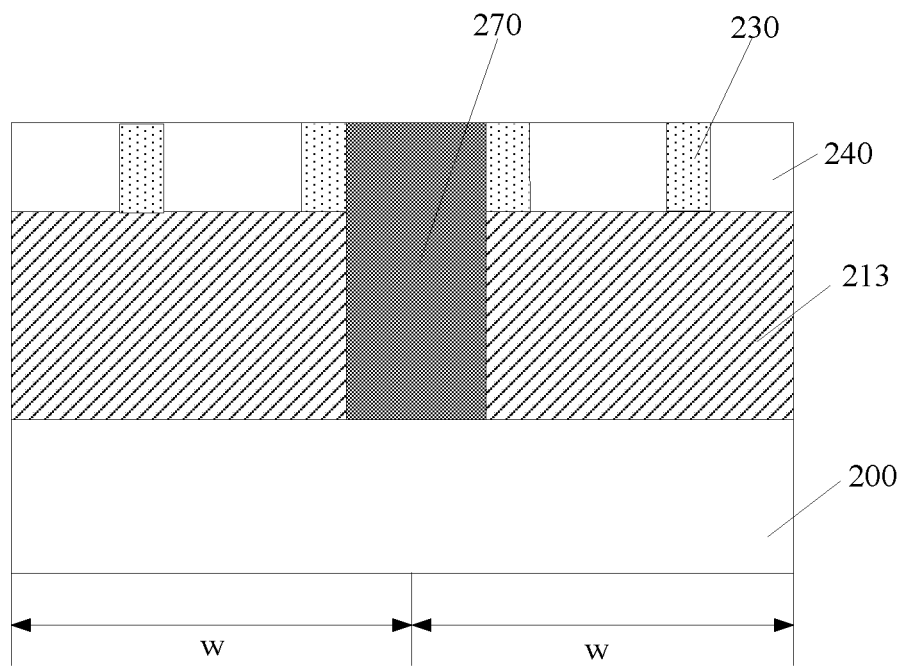
Figure 14:
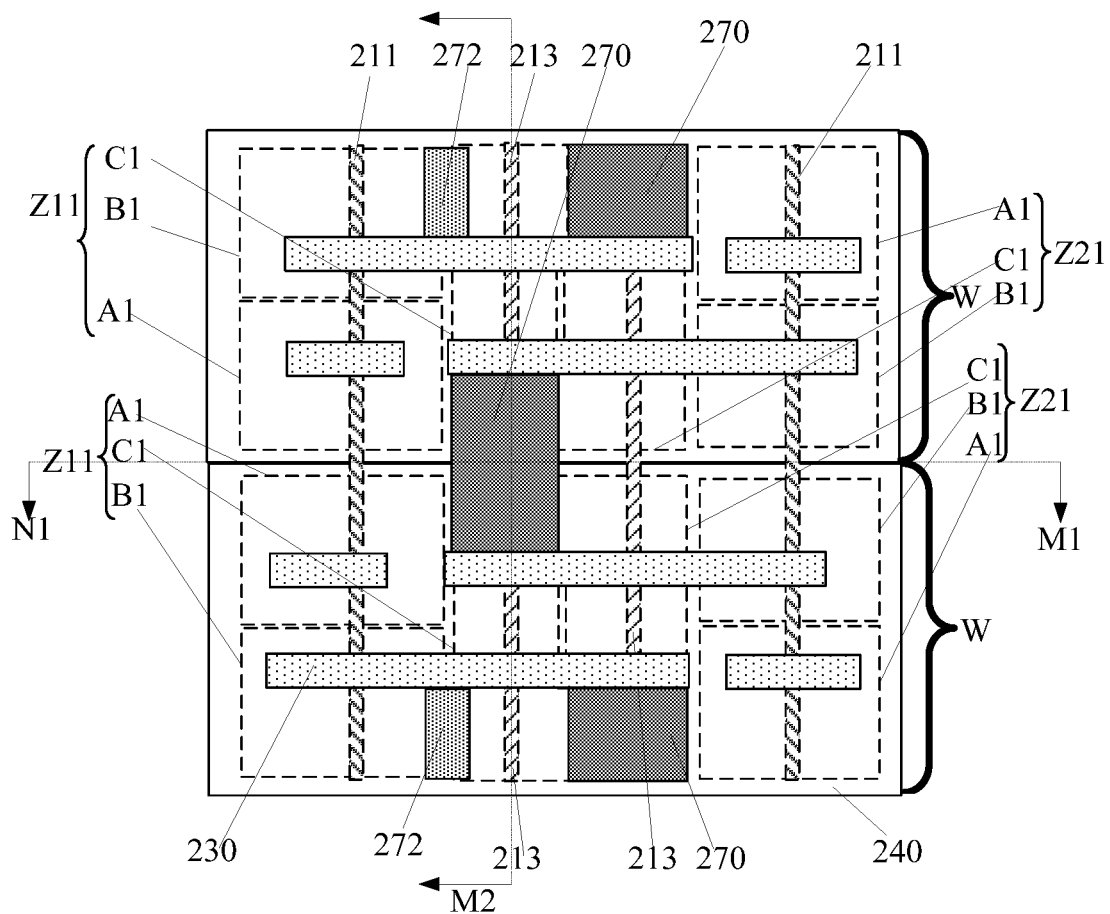

Returning to FIG. 16, after removing mask layer, a cutting structure may be formed (S106). FIGS. 12-14 illustrate a corresponding semiconductor structure.

FIG. 12 illustrates a schematic diagram on the basis of FIG. 10, and FIG. 13 illustrates a schematic diagram on the basis of FIG. 11. FIG. 14 illustrates a top-view of a structure corresponding to FIG. 12 and FIG. 13. FIG. 12 illustrates a cross-sectional view along a cutting line N1-M1 in FIG. 14, and FIG. 13 illustrates a cross-sectional view along a cutting line N2-M2 in FIG. 14. Referring to FIGS. 12-14, a cutting structure 270 may be formed in the cutting opening 261.

In one embodiment, the method may further include cutting the gate structure 230. The gate structure 230 disposed over the transmission region A1 of the first combination region Z11 may be disconnected from the gate structure 230 disposed over the pull-up region C1 of the second combination region Z21. The gate structure 230 disposed over the transmission region A1 of the second combination region Z21 may be disconnected from the gate structure 230 disposed over the pull-up region C1 of the first combination region Z11. The cutting structure 270 may be adjacent to the sidewall spacer of the gate structure 230.

In one embodiment, the cutting structure 270 may have a single-layer structure. The cutting structure 270 may be made of a material different from the dielectric layer 240. The cutting structure 270 may be made of a material including silicon nitride, silicon carbide, aluminum oxide, or aluminum nitride.

In certain embodiments, the cutting structure may have a multilayer structure. A method for forming the cutting structure may include: forming a bottom cutting layer in the cutting opening; and forming a top cutting layer over the bottom cutting layer in the cutting opening. The top cutting layer may be made of a material different from the dielectric layer. The bottom cutting layer may be made of a same material as or a material different from the dielectric layer. The top cutting layer may be made of a material including silicon nitride, silicon carbide, aluminum oxide, or aluminum nitride.

In one embodiment, the method may further include forming a first additional cutting structure 272 in the first additional cutting opening 262; and forming a second additional cutting structure (not illustrated) in the second additional cutting opening. In one embodiment, the first additional cutting structure 272 and the second additional cutting structure may be formed in the process of forming the cutting structure 270, which may simplify the process.

The first additional cutting structure may be disposed on a side of the gate structure, and the second additional cutting structure may be disposed on the other side of the gate structure. The cutting structure 270 and the first additional cutting structure may be disposed on a same side of the gate structure.

In certain embodiments, the method may further include: after forming the cutting structure, the first additional cutting structure, and the second additional cutting structure, removing the dielectric layer; after removing the dielectric layer, forming the first source and drain doped layers in the cutting fin on both sides of the gate structure; and after forming the first source and drain doped layers, forming a replacement dielectric layer covering the sidewall of the gate structure over the semiconductor substrate and the cutting fin.

Returning to FIG. 16, after forming the cutting structure, a first plug structure may be formed (S107). FIG. 15 illustrates a corresponding semiconductor structure.

FIG. 15 illustrates a schematic diagram on the basis of FIG. 14. Referring to FIG. 15, a first plug structure 280 may be formed in the dielectric layer 240 on a side of the gate structure 230. The cutting structure 270 may cut the first plug structure 280 in a width direction of the cutting fin 213.

In one embodiment, a first plug opening may be formed in the dielectric layer 240 on a side of the gate structure 230, and the cutting structure 270 may cut the first plug opening in the width direction of the cutting fin 213. The first plug structure 280 may be formed in the first plug opening.

The first plug structures 280 may be disposed over the transmission region A1 of the first combination region Z11, the pull-up region C1 and the pull-down region B1 of the second combination region Z21, the transmission region A1 of the second combination region Z21, and the pull-up region C1 and the pull-down region B1 of the first combination region Z11, respectively.

The cutting structure 270 disposed over the first combination region Z11 may cut the first plug structure 280 disposed over the transmission region A1 of the second combination region Z21 and the first plug structure 280 disposed over the pull-up region C1 of the first combination region Z11. The cutting structure 270 disposed over the second combination region Z21 may cut the first plug structure 280 disposed over the transmission region A1 of the first combination region Z11 and the first plug structure 280 disposed over the pull-up region C1 of the second combination region Z21.

For the cutting structure 270 disposed over the first combination region Z11, the first plug structure 280 disposed on a side of the cutting structure 270 may be across the first fin 211 disposed over the transmission region A1 of the second combination region Z21; and the first plug structure 280 disposed on the other side of the cutting structure 270 may be across the cutting fin 213 disposed over the pull-up region C1 of the first combination region Z11 and the first fin 211 disposed over the pull-down region B1 of the first combination region Z11. For the cutting structure 270 disposed over the second combination region Z21, the first plug structure 280 disposed on a side of the cutting structure 270 may be across the first fin 211 disposed over the transmission region A1 of the first combination region Z11; and the first plug structure 280 disposed on the other side of the cutting structure 270 may be across the cutting fin 213 disposed over the pull-up region C1 of the second combination region Z21 and the first fin 211 disposed over the pull-down region B1 of the second combination region Z21.

The first additional cutting structure 272 disposed over the first combination region Z11 may cut the first plug structure 280 disposed over the pull-up region C1 of the first combination region Z11 and the first plug structure 280 disposed over the pull-down region B1 of the first combination region Z11. The first additional cutting structure 272 disposed over the second combination region Z21 may cut the first plug structure 280 disposed over the pull-up region C1 of the second combination region Z21 and the first plug structure 280 disposed over the pull-down region B1 of the second combination region Z21.

In one embodiment, the method may further include forming a second plug structure 290 in the dielectric layer 240 on a side of the gate structure 230. The first plug structure 280 and the second plug structure 290 may be located on both sides of the gate structure 230, respectively.

The second additional cutting structure and the second plug structure 290 may be located on a same side of the gate structure. The second additional cutting structure may cut the second plug structure 290. In one embodiment, the second additional cutting structure may cut the second plug structure 290 disposed over the first combination region and the second plug structure 290 disposed over the second combination region.

In one embodiment, when the replacement dielectric layer is formed, the first plug structure and the second plug structure may be formed in the replacement dielectric layer on a side of the gate structure 230.

Correspondingly, the present disclosure also provides a semiconductor device formed by a method in any of disclosed embodiments. Referring to FIG. 15, the semiconductor device may include a semiconductor substrate 200. The semiconductor substrate 200 may include a first plug-cutting region c11 and a fin-cutting region c12. The fin-cutting region c12 may be located within the first plug-cutting region c11. The semiconductor device may also include a cutting structure 270 disposed over the first plug-cutting region c11 and the fin-cutting region c12, and a cutting fin 213 disposed over the semiconductor substrate 200. The cutting fin 213 may be disposed on a side of the cutting structure 270 in an extension direction of the cutting fin 213, and the cutting structure 270 may be adjacent to the cutting fin 213. Moreover, the semiconductor device may include a gate structure 230 across the cutting fin 213 and disposed over the semiconductor substrate 200. The cutting structure 270 may be adjacent to the gate structure 230. In addition, the semiconductor device may include a dielectric layer 240 disposed over the semiconductor substrate 200 and the cutting fin 213 and covering the sidewall of the gate structure 230. Further, the semiconductor device may include a first plug structure 280 in the dielectric layer 240 on a side of the gate structure 230. The cutting structure 270 may cut the first plug structure 280 in a width direction of the cutting fin 213.

The semiconductor device may be a SRAM. The semiconductor substrate 200 may include a memory cell region W, and the memory cell region W may include a first combination region Z11 and a second combination region Z21 that are centrosymmetric. The first combination region Z11 and the second combination region Z21 each may include a transmission region A1, a pull-down region B1, and a pull-up region C1. The first plug-cutting regions c11 may be located in the pull-up region C1 of the first combination region Z11 and the pull-up region C1 of the second combination region Z21, respectively.

The cutting fins 213 may be disposed over the pull-up region C1 of the first combination region Z11 and the pull-up region C1 of the second combination region Z21, respectively. The cutting fin 213 disposed over the first combination region Z11 may be located on a side of the cutting structure 270 disposed over the second combination region Z21 in the extension direction of the cutting fin 213. The cutting fin 213 disposed over the second combination region Z21 may be located on a side of the cutting structure 270 disposed over the first combination region Z11 in the extension direction of the cutting fin 213.

The first plug structures 280 may be disposed over the transmission region A1 of the first combination region Z11, the pull-up region C1 and the pull-down region B1 of the second combination region Z21, the transmission region A1 of the second combination region Z21, and the pull-up region C1 and the pull-down region B1 of the first combination region Z11, respectively.

The semiconductor device may further include first fins 211 respectively disposed over the transmission region A1 and the pull-down region B1 of the first combination region Z11, and over the transmission region A1 and the pull-down region B1 of the second combination region Z21. The gate structure 230 may be across the first fin 211 and the cutting fin 213. The dielectric layer 240 may also be disposed over the first fin 211.

For the cutting structure 270 disposed over the first combination region Z11, the first plug structure 280 disposed on a side of the cutting structure 270 may be across the first fin 211 disposed over the transmission region A1 of the second combination region Z21; and the first plug structure 280 disposed on the other side of the cutting structure 270 may be across the cutting fin 213 disposed over the pull-up region C1 of the first combination region Z11 and the first fin 211 disposed over the pull-down region B1 of the first combination region Z11. For the cutting structure 270 disposed over the second combination region Z21, the first plug structure 280 disposed on a side of the cutting structure 270 may be across the first fin 211 disposed over the transmission region A1 of the first combination region Z11; and first plug structure 280 disposed on the other side of the cutting structure 270 may be across the cutting fin 213 disposed over the pull-up region C1 of the second combination region Z21 and the first fin 211 disposed over the pull-down region B1 of the second combination region Z21.

The gate structure 230 disposed over the transmission region A1 of the first combination region Z11 may be disconnected from the gate structure 230 disposed over the pull-up region C1 of the second combination region Z21. The gate structure 230 disposed over the transmission region A1 of the second combination region Z21 may be disconnected from the gate structure 230 disposed over the pull-up region C1 of the first combination region Z11.

In one embodiment, the cutting structure 270 may have a single-layer structure. The cutting structure 270 may be made of a material different from the dielectric layer 240. The cutting structure 270 may be made of a material including silicon nitride, silicon carbide, aluminum oxide, or aluminum nitride.

In certain embodiments, the cutting structure may have a multilayer structure. The cutting structure may include a bottom cutting layer disposed over the first plug-cutting region, and a top cutting layer disposed over the bottom cutting layer. The top cutting layer may be made of a material different from the dielectric layer. The bottom cutting layer may be made of a same material as or a material different from the dielectric layer. The top cutting layer may be made of a material including silicon nitride, silicon carbide, aluminum oxide, or aluminum nitride.

In one embodiment, the size of the overlapped region between the gate structure 230 and the cutting fin 213 in the extension direction of the cutting fin 213 may be equal to the size of the gate structure 230 in the extension direction of the cutting fin 213.

The gate structure 230 may include an intrinsic gate structure and a sidewall spacer located on a sidewall of the intrinsic gate structure. The cutting structure 270 may be adjacent to the sidewall spacer.

In the disclosed method for forming the semiconductor device, the cutting structure may be formed. The cutting structure may cut the first plug structure in the width direction of the cutting fin, such that the first plug structures on both sides of the cutting structure in the width direction of the cutting fin may be disconnected. The first plug structures on both sides of the cutting structure in the width direction of the cutting fin may be prevented from being short-circuited, which may satisfy the process design requirements.

The dielectric layer disposed over the first plug-cutting region and the initial to-be-cut fin disposed over the fin-cutting region may be removed to form the cutting opening disposed over the first plug-cutting region, and the initial to-be-cut fin may form the cutting fin on a side of the cutting opening. The sidewall of the cutting opening may expose the gate structure, such that the cutting structure may be adjacent to the gate structure, and the cutting structure may be adjacent to the sidewall of the cutting fin in the extension direction of the first fin. Therefore, an end of the cutting fin close to the cutting structure may not protrude from the gate structure, which may prevent the source and drain material from growing over the fin-cutting region.

In the extension direction of the cutting fin, the size of the overlapped region between the gate structure and the cutting fin may be substantially large, which may facilitate the growth of source and drain in the cutting fin, such that the morphology of the source and drain in the cutting fin may be desired. Accordingly, the performance of semiconductor device may be improved.

Further, etching and removing the dielectric layer disposed over the first plug-cutting region and the initial to-be-cut fin disposed over the fin-cutting region may be performed in a same process, such that the first plug structure may be cut during the process of cutting the initial to-be-cut fin, which may simplify the process steps.

In the disclosed semiconductor device, the cutting structure may cut the first plug structure in the width direction of the cutting fin, such that the first plug structures on both sides of the cutting structure in the width direction of the cutting fin may be disconnected. The first plug structures on both sides of the cutting structure in the width direction of the cutting fin may be prevented from being short-circuited, which may satisfy the process design requirements. The cutting structure may be adjacent to the gate structure, and the cutting structure may be adjacent to the sidewall of the cutting fin in the extension direction of the first fin. Therefore, an end of the cutting fin close to the cutting structure may not protrude from the gate structure, which may prevent the source and drain material from growing over the fin-cutting region.

In the extension direction of the cutting fin, the size of the overlapped region between the gate structure and the cutting fin may be substantially large, which may facilitate the growth of source and drain in the cutting fin, such that the morphology of the source and drain in the cutting fin may be desired. Accordingly, the performance of semiconductor device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor device, comprising:
    providing a semiconductor substrate, wherein the semiconductor substrate includes a first plug-cutting region and a fin-cutting region, and the fin-cutting region is located within the first plug-cutting region;
    forming an initial to-be-cut fin on the semiconductor substrate, wherein the initial to-be-cut fin is partially extended to the fin-cutting region;
    forming a gate structure across the initial to-be-cut fin over the semiconductor substrate, wherein the fin-cutting region and the first plug-cutting region are located on a side of the gate structure;
    forming a dielectric layer covering a sidewall of the gate structure over the semiconductor substrate and the initial to-be-cut fin;
    forming a cutting opening over the first plug-cutting region by removing a portion of the dielectric layer that is over the first plug-cutting region and a portion of the initial to-be-cut fin that is over the fin-cutting region, wherein a remaining initial to-be-cut fin forms a cutting fin on a side of the cutting opening, and a sidewall of the cutting opening exposes the gate structure;
    forming a cutting structure in the cutting opening; and
    forming a first plug structure in a remaining dielectric layer on a side of the gate structure, wherein the cutting structure cuts the first plug structure in a width direction of the cutting fin.

2. The method according to claim 1, wherein:
the semiconductor device is a static random access memory (SRAM),
the semiconductor substrate includes a memory cell region, and each memory cell region includes a first combination region and a second combination region that are centrosymmetric in each memory cell,
the first combination region and the second combination region each includes a transmission region, a pull-down region, and a pull-up region,
first plug-cutting regions are respectively located in the pull-up region of the first combination region and the pull-up region of the second combination region,
initial to-be-cut fins are respectively disposed over the pull-up region of the first combination region and the pull-up region of the second combination region, an initial to-be-cut fin over the first combination region is extended to a fin-cutting region of the second combination region, and an initial to-be-cut fin over the second combination region is extended to a fin-cutting region of the first combination region,
cutting fins are respectively disposed over the pull-up region of the first combination region and the pull-up region of the second combination region, a cutting fin disposed over the first combination region is located on a side of a cutting structure disposed over the second combination region in an extension direction of the cutting fin, and a cutting fin disposed over the second combination region is located on a side of a cutting structure disposed over the first combination region in the extension direction of the cutting fin, and
first plug structures are respectively disposed over the transmission region of the first combination region, the pull-up region and the pull-down region of the second combination region, the transmission region of the second combination region, and the pull-up region and the pull-down region of the first combination region.

3. The method according to claim 2, before forming the gate structure, further including:
forming first fins over the transmission region and the pull-down region of the first combination region and over the transmission region and the pull-down region of the second combination region, respectively, wherein:
before forming the dielectric layer, the gate structure is across a first fin and the initial to-be-cut fin,
the dielectric layer is further formed over the first fin,
for cutting structures disposed over the first combination region, a first plug structure disposed on a side of the cutting structure is across the first fin disposed over the transmission region of the second combination region, and a first plug structure disposed on another side of the cutting structure is across the cutting fin disposed over the pull-up region of the first combination region, and
for cutting structures disposed over the second combination region, a first plug structure disposed on a side of the cutting structure is across the first fin disposed over the transmission region of the first combination region, and a first plug structure disposed on another side of the cutting structure is across the cutting fin disposed over the pull-up region of the second combination region.

4. The method according to claim 2, further including:
cutting gate structures, wherein a gate structure disposed over the transmission region of the first combination region is disconnected from a gate structure disposed over the pull-up region of the second combination region, and a gate structure disposed over the transmission region of the second combination region is disconnected from a gate structure disposed over the pull-up region of the first combination region.

5. The method according to claim 1, wherein forming the cutting opening includes:
forming a mask layer over the dielectric layer and the gate structure, wherein the mask layer contains a mask opening, and the mask opening is located over the first plug-cutting region,
removing the portion of the dielectric layer that is over the first plug-cutting region and the portion of the initial to-be-cut fin that is over the fin-cutting region using the mask layer as a mask, to form the cutting opening, and
after removing the portion of the dielectric layer and the portion of the initial to-be-cut fin, removing the mask layer.

6. The method according to claim 1, wherein:
the cutting structure has a single-layer structure, wherein the cutting structure is made of a material different from the dielectric layer.

7. The method according to claim 1, wherein:
the cutting structure has a multilayer structure, and a method for forming the cutting structure includes:
forming a bottom cutting layer in the cutting opening, and
forming a top cutting layer over the bottom cutting layer in the cutting opening, wherein:
the top cutting layer is made of a material different from the dielectric layer, and
the bottom cutting layer is made of a same material as or a material different from the dielectric layer.

8. The method according to claim 1, further including:
before forming the dielectric layer, forming first source and drain doped layers in the initial to-be-cut fin on both sides of the gate structure; and
during the process of removing the portion of the dielectric layer that is over the first plug-cutting region and the portion of the initial to-be-cut fin that is over the fin-cutting region, removing the first source and drain doped layers disposed over the first plug-cutting region on a side of the gate structure.

9. The method according to claim 1, wherein:
the gate structure includes an intrinsic gate structure and a sidewall spacer disposed on a sidewall of the intrinsic gate structure, wherein the sidewall of the cutting opening exposes the sidewall spacer, and the cutting structure is adjacent to the sidewall spacer.

10. A semiconductor device, comprising:
a semiconductor substrate, wherein the semiconductor substrate includes a first plug-cutting region and a fin-cutting region, and the fin-cutting region is located within the first plug-cutting region;
a cutting structure disposed over the first plug-cutting region and the fin-cutting region;
a cutting fin disposed over the semiconductor substrate, wherein the cutting fin is disposed on a side of the cutting structure in an extension direction of the cutting fin, and the cutting structure is adjacent to the cutting fin;
a gate structure across the cutting fin and disposed over the semiconductor substrate, wherein the cutting structure is adjacent to the gate structure;
a dielectric layer disposed over the semiconductor substrate and the cutting fin, and covering a sidewall of the gate structure; and a first plug structure in the dielectric layer on a side of the gate structure, wherein the cutting structure cuts the first plug structure in a width direction of the cutting fin.

11. The semiconductor device according to claim 10, wherein:
   the semiconductor device is a static random access memory (SRAM),
   the semiconductor substrate includes a memory cell region, and each memory cell region includes a first combination region and a second combination region that are centrosymmetric in each memory cell,
   the first combination region and the second combination region each includes a transmission region, a pull-down region, and a pull-up region,
   first plug-cutting regions are respectively located in the pull-up region of the first combination region and the pull-up region of the second combination region,
   cutting fins are respectively disposed over the pull-up region of the first combination region and the pull-up region of the second combination region, a cutting fin disposed over the first combination region is located on a side of a cutting structure disposed over the second combination region in the extension direction of the cutting fin, and a cutting fin disposed over the second combination region is located on a side of a cutting structure disposed over the first combination region in the extension direction of the cutting fin, and
   first plug structures are respectively disposed over the transmission region of the first combination region, the pull-up region and the pull-down region of the second combination region, the transmission region of the second combination region, and the pull-up region and the pull-down region of the first combination region.

12. The semiconductor device according to claim 11, further including:
   first fins respectively disposed over the transmission region and the pull-down region of the first combination region and over the transmission region and the pull-down region of the second combination region, wherein:
   the gate structure is across a first fin and the cutting fin,
   the dielectric layer is further disposed over the first fin,
   for the cutting structures disposed over the first combination region, a first plug structure disposed on a side of the cutting structure is across the first fin disposed over the transmission region of the second combination region, and a first plug structure disposed on another side of the cutting structure is across the cutting fin disposed over the pull-up region of the first combination region, and
   for the cutting structures disposed over the second combination region, a first plug structure disposed on a side of the cutting structure is across the first fin disposed over the transmission region of the first combination region, and a first plug structure disposed on another side of the cutting structure is across the cutting fin disposed over the pull-up region of the second combination region.

13. The semiconductor device according to claim 10, wherein:
   a gate structure disposed over the transmission region of the first combination region is disconnected from a gate structure disposed over the pull-up region of the second combination region, and
   a gate structure disposed over the transmission region of the second combination region is disconnected from a gate structure disposed over the pull-up region of the first combination region.

14. The semiconductor device according to claim 10, wherein:
   the cutting structure has a single-layer structure, wherein the cutting structure is made of a material different from the dielectric layer.

15. The semiconductor device according to claim 14, wherein:
   the cutting structure is made of a material including silicon nitride, silicon carbide, aluminum oxide, or aluminum nitride.

16. The semiconductor device according to claim 10, wherein:
   the cutting structure has a multilayer structure, the cutting structure including:
   a bottom cutting layer disposed over the first plug-cutting region, and
   a top cutting layer disposed over the bottom cutting layer, wherein:
   the top cutting layer is made of a material different from the dielectric layer, and
   the bottom cutting layer is made of a same material as or a material different from the dielectric layer.

17. The semiconductor device according to claim 16, wherein:
   the top cutting layer is made of a material including silicon nitride, silicon carbide, aluminum oxide, or aluminum nitride.

18. The semiconductor device according to claim 10, wherein:
   a size of an overlapped region between the gate structure and the cutting fin in the extension direction of the cutting fin is equal to a size of the gate structure in the extension direction of the cutting fin.

19. The semiconductor device according to claim 10, wherein:
   the gate structure includes an intrinsic gate structure and a sidewall spacer disposed on a sidewall of the intrinsic gate structure, wherein the cutting structure is adjacent to the sidewall spacer.

* * * * *